United States Patent
Fifield

(10) Patent No.: US 9,398,683 B2
(45) Date of Patent: Jul. 19, 2016

(54) PACKAGED CAPACITOR COMPONENT WITH MULTIPLE SELF-RESONANCE FREQUENCIES

(71) Applicant: Apple Inc., Cupertino, CA (US)

(72) Inventor: David Fifield, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 565 days.

(21) Appl. No.: 13/850,756

(22) Filed: Mar. 26, 2013

(65) Prior Publication Data

US 2014/0292599 A1   Oct. 2, 2014

(51) Int. Cl.

| | |
|---|---|
| *H01G 4/228* | (2006.01) |
| *H05K 1/02* | (2006.01) |
| *H01G 4/38* | (2006.01) |
| *H01G 4/40* | (2006.01) |
| *H01G 4/012* | (2006.01) |
| *H05K 1/18* | (2006.01) |

(52) U.S. Cl.
CPC ............. *H05K 1/0239* (2013.01); *H01G 4/012* (2013.01); *H01G 4/228* (2013.01); *H01G 4/385* (2013.01); *H01G 4/40* (2013.01); *H05K 1/181* (2013.01); *H05K 1/0233* (2013.01); *H05K 2201/10015* (2013.01); *H05K 2201/1053* (2013.01); *H05K 2201/10515* (2013.01); *Y02P 70/611* (2015.11)

(58) Field of Classification Search
CPC ......... H01G 4/00; H01G 4/008; H01G 4/228; H01G 4/385; H01G 4/40

USPC .............. 343/702, 745, 749; 361/306.3, 313, 361/321.1, 301.1, 301.4, 302, 306.1; 331/143, 144; 607/36

See application file for complete search history.

(56) References Cited

U.S. PATENT DOCUMENTS

| | | | | |
|---|---|---|---|---|
| 5,835,338 | A * | 11/1998 | Suzuki .................... | H01G 4/30 361/301.4 |
| 5,870,273 | A * | 2/1999 | Sogabe ................... | H01G 4/40 338/20 |
| 5,910,879 | A * | 6/1999 | Herbert .................. | H01G 4/228 361/306.1 |
| 6,046,902 | A * | 4/2000 | Nakagawa ............. | H01G 4/228 361/306.1 |
| 7,057,875 | B2 * | 6/2006 | Fujiyama ................ | H01G 4/40 361/301.1 |

(Continued)

*Primary Examiner* — Tho G Phan
(74) *Attorney, Agent, or Firm* — Treyz Law Group, P.C.; Michael H. Lyons

(57) ABSTRACT

A packaged capacitor component such as a surface mount technology capacitor component may be formed with multiple self-resonant frequencies. The capacitor component may include multiple capacitor portions separated by dielectric layers. The capacitor portions may each be formed from interleaving conductive layers. Additional dielectric layers may be interposed between the interleaving conductive layers. Each capacitor portion may be characterized by a corresponding self-resonance frequency. If desired, a packaged capacitor component having multiple self-resonant frequencies may be formed by stacking multiple surface-mount capacitor components. Each of the stacked surface-mount capacitor components may include interleaving conductive layers that are centered between top and bottom surfaces of that component. Packaged capacitor components having multiple self-resonance frequencies may be used as direct-current blocking capacitors or decoupling capacitors.

16 Claims, 13 Drawing Sheets

(56) References Cited

U.S. PATENT DOCUMENTS

| | | | |
|---|---|---|---|
| 7,310,217 B2 * | 12/2007 | Takashima | H01G 4/385 361/306.1 |
| 7,478,353 B2 | 1/2009 | Tran | |
| 7,561,407 B1 * | 7/2009 | Chen | H01G 4/005 361/302 |
| 7,580,241 B2 * | 8/2009 | Sakashita | C04B 35/462 361/306.1 |
| 7,684,170 B2 | 3/2010 | Heyen et al. | |
| 7,957,806 B2 * | 6/2011 | Stevenson | H01G 4/40 361/302 |
| 8,237,909 B2 | 8/2012 | Ostreko et al. | |
| 8,355,240 B2 | 1/2013 | Satou | |
| 2005/0280134 A1 | 12/2005 | Gibson et al. | |
| 2006/0250748 A1 * | 11/2006 | Purple | H01G 4/228 361/306.1 |

* cited by examiner

PACKAGED CAPACITOR COMPONENT WITH MULTIPLE SELF-RESONANCE FREQUENCIES

BACKGROUND

This invention relates generally to electronic devices, and more particularly, to electronic devices including capacitor circuitry.

Electronic devices such as handheld electronic devices and other portable electronic devices are becoming increasingly popular. Examples of handheld devices include cellular telephones, handheld computers, media players, and hybrid devices that include the functionality of multiple devices of this type. Popular portable electronic devices that are somewhat larger than traditional handheld electronic devices include laptop computers and tablet computers.

Due in part to their mobile nature, portable electronic devices are often provided with wireless communications capabilities. For example, portable electronic devices may use long-range wireless communications to communicate with wireless base stations and may use short-range wireless communications links such as links for supporting the Wi-Fi® (IEEE 802.11) bands at 2.4 GHz and 5 GHz and the Bluetooth® band at 2.4 GHz.

Wireless communications circuitry often includes discrete components such as discrete capacitor components. Such discrete components are typically packaged and mounted to a printed circuit board. However, packaged components include parasitics that contribute to non-ideal functionality. For example, a packaged capacitor component includes parasitic inductance associated with package terminations such as leads or conductive termination caps. In this scenario, the combination of capacitance and inductance produces a self-resonant frequency above which the packaged capacitor component appears inductive. Such self-resonant characteristics can be useful for single-band applications where the capacitor has a low-impedance at the self-resonant frequency. However, for dual or multiple band applications, such self-resonant characteristics are undesirable. Consider the scenario in which a radio-frequency path is used for communications on both 2.4 GHz and 5 GHz. In this scenario, a single capacitor component in the radio-frequency path that serves as a direct-current (DC) blocking capacitor can only have one self-resonant frequency which must be chosen either to provide a low-impedance in the 2.4 GHz band, or a low-impedance in the 5 GHz band, or somewhere in between the two. Thus, the value of a single DC blocking capacitor chosen for dual-band 2.4 GHz and 5 GHz applications must necessarily be a compromise between the two bands of operation and the RF signal loss (due to the impedance of the capacitor in series with the transmission line) ends up being non-optimal for either band.

It would therefore be desirable to be able to provide packaged capacitor components with improved self-resonance characteristics.

SUMMARY

An electronic capacitor component may include multiple self-resonant frequencies. The electronic capacitor component may be a packaged surface mount technology component having terminals (terminations). The capacitor component may include first and second capacitor portions separated by a dielectric layer. The first and second capacitor portions may each be formed from interleaving conductive layers. Additional dielectric layers may be interposed between the interleaving conductive layers. Each conductive layer may be offset from adjacent conductive layers and may be coupled to a respective terminal.

The first and second capacitor portions may be characterized by respective self-resonant frequencies. If desired, additional capacitor portions may be formed having additional self-resonant frequencies. Dielectric layers interposed between the capacitor portions may electrically and physically separate the capacitor portions.

If desired, a packaged capacitor component having multiple self-resonant frequencies may be formed by stacking multiple surface-mount technology capacitor components. Each surface-mount technology capacitor component may include interleaving conductive layers that are centered between top and bottom surfaces of that component. Dielectric layers may electrically and physically separate the conductive layers from the top and bottom surfaces of that component.

Packaged capacitor components having multiple self-resonant frequencies may be used in radio-frequency communications circuitry as direct-current blocking capacitors or decoupling capacitors. If desired, the self-resonant frequencies of a packaged capacitor component may be selected to form a frequency window suitable for filtering noise as a decoupling capacitor.

Further features of the present invention, its nature and various advantages will be more apparent from the accompanying drawings and the following detailed description.

DETAILED DESCRIPTION

The present invention relates generally to packaged components, and more particularly, to packaged capacitor components having multiple self-resonant frequencies. The packaged capacitor components may be used in wireless electronic devices.

The wireless electronic devices may be portable electronic devices such as laptop computers or small portable computers of the type that are sometimes referred to as ultraportables. Portable electronic devices may include tablet computing devices (e.g., a portable computer that includes a touch-screen display). Portable electronic devices may also be somewhat smaller devices. Examples of smaller portable electronic devices include wrist-watch devices, pendant devices, headphone and earpiece devices, and other wearable and miniature devices. With one suitable arrangement, the portable electronic devices may be handheld electronic devices.

The wireless electronic devices may be, for example, cellular telephones, media players with wireless communications capabilities, handheld computers (also sometimes called personal digital assistants), remote controllers, global positioning system (GPS) devices, tablet computers, and handheld gaming devices. The wireless electronic devices may also be hybrid devices that combine the functionality of multiple conventional devices. Examples of hybrid portable electronic devices include a cellular telephone that includes media player functionality, a gaming device that includes a wireless communications capability, a cellular telephone that includes game and email functions, and a portable device that receives email, supports mobile telephone calls, has music player functionality, and supports web browsing. These are merely illustrative examples.

Figure 1:
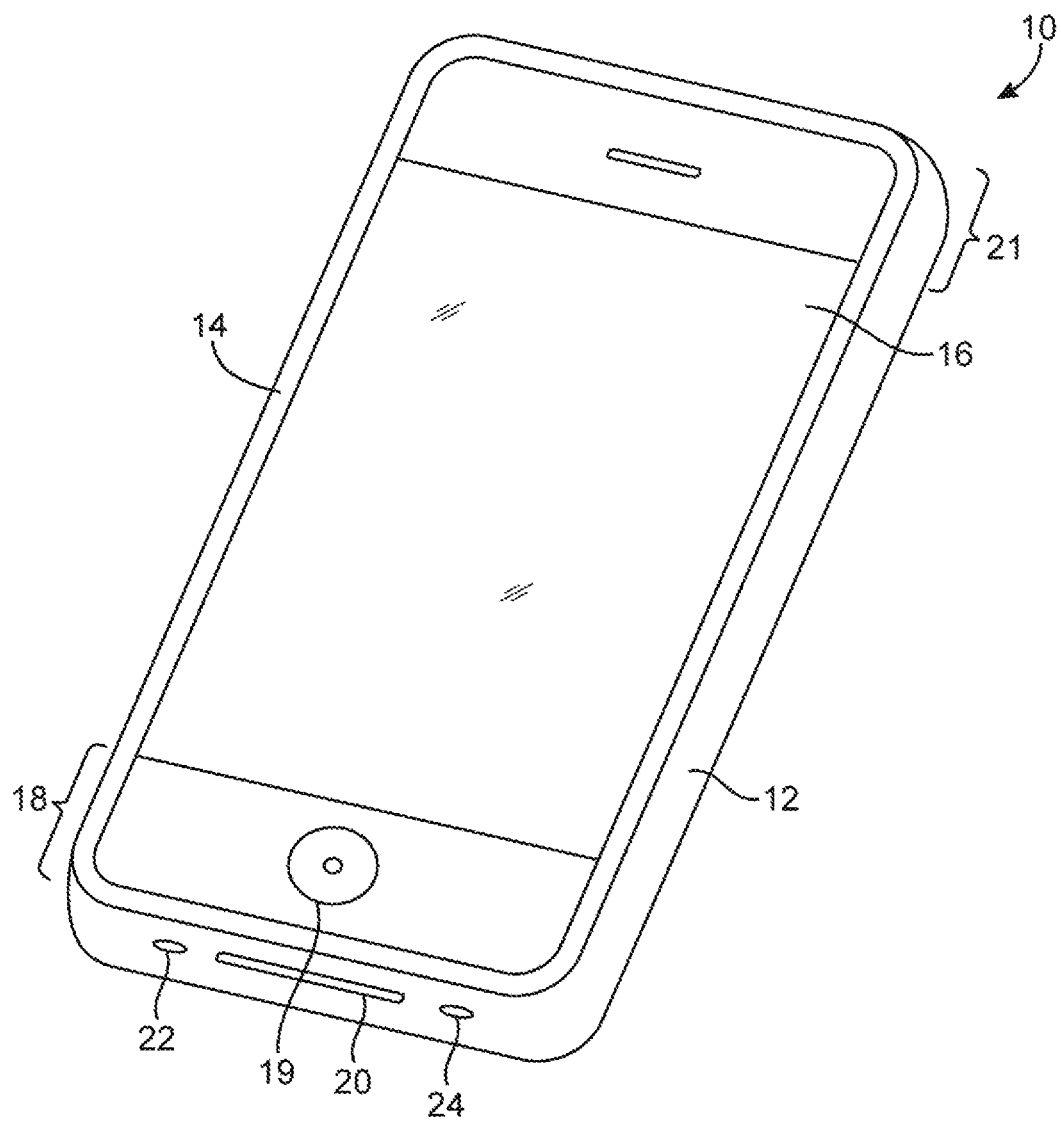
FIG. 1 is a perspective view of an illustrative electronic device that may include a packaged capacitor component with multiple self-resonant frequencies in accordance with an embodiment of the present invention.

An illustrative wireless electronic device in accordance with an embodiment of the present invention is shown in FIG. 1. Device 10 of FIG. 1 may be, for example, a portable electronic device.

Device 10 may have housing 12. Antennas for handling wireless communications may be housed within housing 12 (as an example).

Housing 12, which is sometimes referred to as a case, may be formed of any suitable materials including, plastic, glass, ceramics, metal, or other suitable materials, or a combination of these materials. In some situations, housing 12 or portions of housing 12 may be formed from a dielectric or other low-conductivity material, so that the operation of conductive antenna elements that are located in proximity to housing 12 is not disrupted. Housing 12 or portions of housing 12 may also be formed from conductive materials such as metal. An illustrative housing material that may be used is anodized aluminum. Aluminum is relatively light in weight and, when anodized, has an attractive insulating and scratch-resistant surface. If desired, other metals can be used for the housing of device 10, such as stainless steel, magnesium, titanium, alloys of these metals and other metals, etc. In scenarios in which housing 12 is formed from metal elements, one or more of the metal elements may be used as part of the antennas in device 10. For example, metal portions of housing 12 may be shorted to an internal ground plane in device 10 to create a larger ground plane element for that device 10. To facilitate electrical contact between an anodized aluminum housing and other metal components in device 10, portions of the anodized surface layer of the anodized aluminum housing may be selectively removed during the manufacturing process (e.g., by laser etching).

Housing 12 may have a bezel 14. The bezel 14 may be formed from a conductive material and may serve to hold a display or other device with a planar surface in place on device 10. As shown in FIG. 1, for example, bezel 14 may be used to hold display 16 in place by attaching display 16 to housing 12.

Display 16 may be a liquid crystal diode (LCD) display, an organic light emitting diode (OLED) display, or any other suitable display. The outermost surface of display 16 may be formed from one or more plastic or glass layers. If desired, touch screen functionality may be integrated into display 16 or may be provided using a separate touch pad device.

Display screen 16 (e.g., a touch screen) is merely one example of an input-output device that may be used with electronic device 10. If desired, electronic device 10 may have other input-output devices (e.g., input-output devices 32 of FIG. 2). For example, electronic device 10 may have user input control devices such as button 19, and input-output components such as port 20 and one or more input-output jacks (e.g., for audio and/or video). Button 19 may be, for example, a menu button. Port 20 may include a reversible data connector such as an 8-pin data connector. This example is merely illustrative. If desired, port 20 may contain a non-reversible 30-pin data connector or other non-reversible data connectors. Openings 24 and 22 may, if desired, form microphone and speaker ports. In the example of FIG. 1, display screen 16 is shown as being mounted on the front face of portable electronic device 10, but display screen 16 may, if desired, be mounted on the rear face of portable electronic device 10, on a side of device 10, on a flip-up portion of device 10 that is attached to a main body portion of device 10 by a hinge (for example), or using any other suitable mounting arrangement.

A user of electronic device 10 may supply input commands using user input interface devices such as button 19 and touch screen 16. Suitable user input interface devices for electronic device 10 include buttons (e.g., alphanumeric keys, power on-off, power-on, power-off, and other specialized buttons, etc.), a touch pad, pointing stick, or other cursor control device, a microphone for supplying voice commands, or any other suitable interface for controlling device 10. Although shown schematically as being formed on the top face of electronic device 10 in the example of FIG. 1, buttons such as button 19 and other user input interface devices may generally be formed on any suitable portion of electronic device 10. For example, a button such as button 19 or other user interface control may be formed on the side of electronic device 10. Buttons and other user interface controls can also be located on the top face, rear face, or other portion of device 10. If desired, device 10 can be controlled remotely (e.g., using an infrared remote control, a radio-frequency remote control such as a Bluetooth remote control, etc.).

Electronic device 10 may have ports such as port 20. Port 20, which may sometimes be referred to as a dock connector, data port connector, input-output port, or bus connector, may be used as an input-output port (e.g., when connecting device 10 to a mating dock connected to a computer or other electronic device). Device 10 may also have audio and video jacks that allow device 10 to interface with external components. Typical ports include power jacks to recharge a battery within device 10 or to operate device 10 from a direct current (DC) power supply, data ports to exchange data with external components such as a personal computer or peripheral, audio-visual jacks to drive headphones, a monitor, or other external audio-video equipment, a subscriber identity module (SIM) card port to authorize cellular telephone service, a memory card slot, etc. The functions of some or all of these devices and the internal circuitry of electronic device 10 can be controlled using input interface devices such as touch screen display 16.

Examples of locations in which antenna structures may be located in device 10 include region 18 (e.g., a first antenna) and region 21 (e.g., a second antenna). These are merely illustrative examples. Any suitable portion of device 10 may be used to house antenna structures for device 10 if desired.

Figure 2:
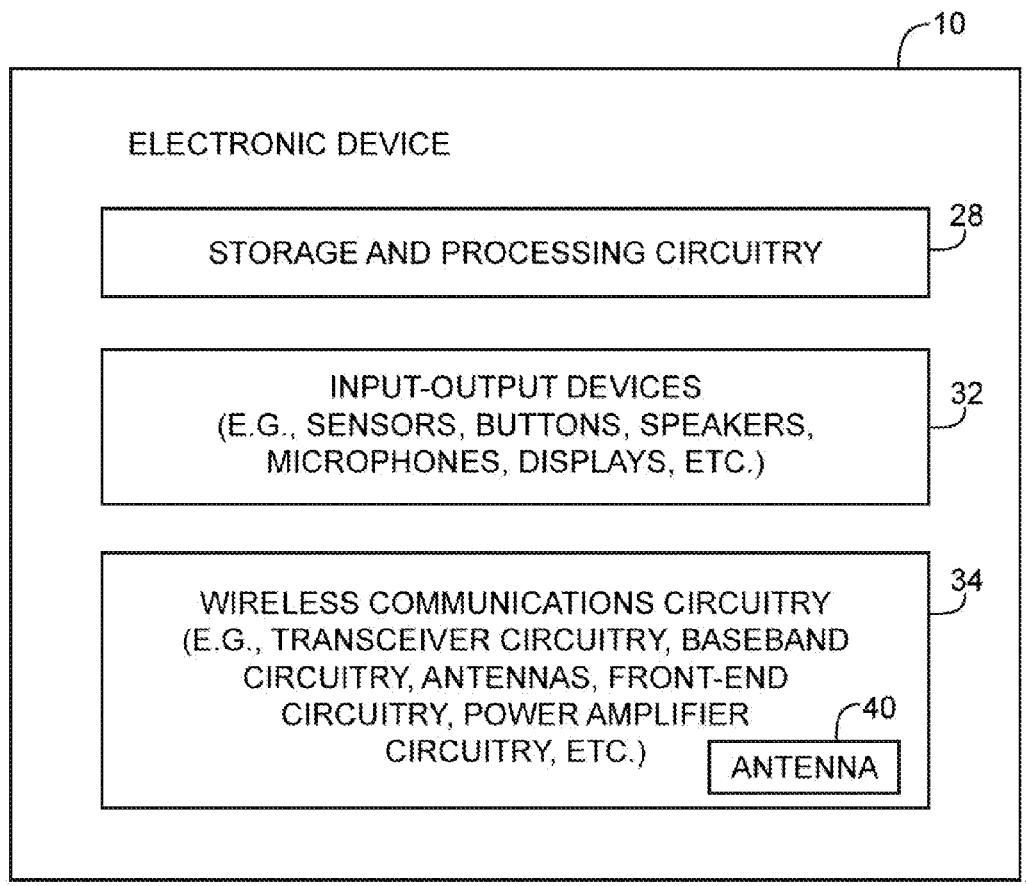
FIG. 2 is a diagram of an illustrative electronic device with wireless communications circuitry that may include a packaged capacitor component in accordance with an embodiment of the present invention.

Wireless electronic devices such as device 10 of FIG. 2 may be provided with wireless communications circuitry. The wireless communications circuitry may be used to support long-range wireless communications such as communications in cellular telephone frequency bands (e.g., ranges of frequencies associated with wireless standards or protocols). Examples of long-range (cellular telephone) bands that may be handled by device 10 include the 800 MHz band, the 850 MHz band, the 900 MHz band, the 1800 MHz band, the 1900 MHz band, the 2100 MHz band, the 700 MHz band, the 2500 MHz band, and other frequency bands. Each long-range band may be associated with a range of frequencies. For example, the 850 MHz band may be associated with frequency range 824-849 MHz and the 2500 MHz band may be associated with frequency range 2500-2570 MHz. Examples of wireless standards or protocols that are associated with the cellular telephone frequency bands include Global System for Mobile (GSM) communications standard, the Universal Mobile Telecommunications System (UMTS) standard, and standards that use technologies such as Code Division Multiple Access, time division multiplexing, frequency division multiplexing, etc. The long-range bands used by device 10 may include the so-called LTE (Long Term Evolution) bands. The LTE bands are numbered (e.g., 1, 2, 3, etc.) and are sometimes referred to as E-UTRA operating bands. As an example, LTE band 7 corresponds to uplink frequencies between 2.50 GHz and 2.57 GHz (e.g., frequencies used to transmit wireless signals to a base station) and downlink frequencies between 2.62 GHz and 2.69 (e.g., frequencies used to receive wireless signals from a base station).

Long-range signals such as signals associated with satellite navigation bands may be received by the wireless communications circuitry of device 10. For example, device 10 may use wireless circuitry to receive signals in the 1575 MHz band associated with Global Positioning System (GPS) communications. Short-range wireless communications may also be supported by the wireless circuitry of device 10. For example, device 10 may include wireless circuitry for handling local area network links such as WiFi® links at 2.4 GHz and 5 GHz, Bluetooth links and Bluetooth Low Energy links at 2.4 GHz, etc.

As shown in FIG. 2, device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, functions related to radio-frequency transmission and reception such as selection of communications frequencies, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as Wi-Fi®), protocols for other short-range wireless communications links such as the Bluetooth protocol, cellular telephone protocols, MIMO (multiple input multiple output) protocols, antenna diversity protocols, etc. Wireless communications operations such as communications frequency selection operations may be controlled using software stored and running on device 10 (e.g., stored and running on storage and processing circuitry 28).

Electronic device 10 may include wireless communications circuitry 34 for communicating wirelessly with external equipment. Therefore, electronic device 10 may sometimes be referred to as a wireless device or a wireless electronic device. Wireless communications circuitry 34 may include radio-frequency (RF) transceiver circuitry formed from one or more integrated circuits, baseband circuitry, power amplifier circuitry, low-noise amplifiers, passive RF components, one or more antennas, transmission lines such as microstrip paths, and other circuitry such as front-end circuitry for handling RF wireless signals. Wireless communications circuitry 34 may include discrete components such as packaged capacitor components mounted to a printed circuit substrate. Wireless signals can also be sent using light (e.g., using infrared communications).

Wireless communications circuitry 34 may include radio-frequency transceiver circuitry for handling various radio-frequency communications bands. For example, circuitry 34 may include transceiver circuitry that handles 2.4 GHz and 5 GHz bands for WiFi (IEEE 802.11) communications and/or handles the 2.4 GHz band for Bluetooth communications. Circuitry 34 may include cellular telephone transceiver circuitry for handling wireless communications in cellular telephone bands such as at 850 MHz, 900 MHz, 1800 MHz, 1900 MHz, 2100 MHz, the LTE bands, and other bands (as examples). Circuitry 34 may handle voice data and non-voice data. If desired, wireless communications circuitry 34 may include global positioning system (GPS) receiver equipment for receiving GPS signals at 1575 MHz or for handling other satellite positioning data.

Wireless communications circuitry 34 may include one or more antennas 40. Antennas 40 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna. This example is merely illustrative. If desired, an antenna may be used for remote and local wireless links. For example, an antenna may be used to support local Wi-Fi communications on the 2.4 GHz frequency band and cellular communications on the 800 MHz frequency band.

Antenna diversity schemes may be implemented in which multiple redundant antennas are used in handling communications for a particular band or set of bands. In an antenna diversity scheme, storage and processing circuitry 28 may select which antenna to use in real time based on signal strength measurements or other data. For example, storage and processing circuitry 28 may select which antenna to use for LTE communications with a base station. In multiple-input-multiple-output (MIMO) schemes, multiple antennas may be used to transmit and receive multiple data streams, thereby enhancing data throughput.

Figure 3:
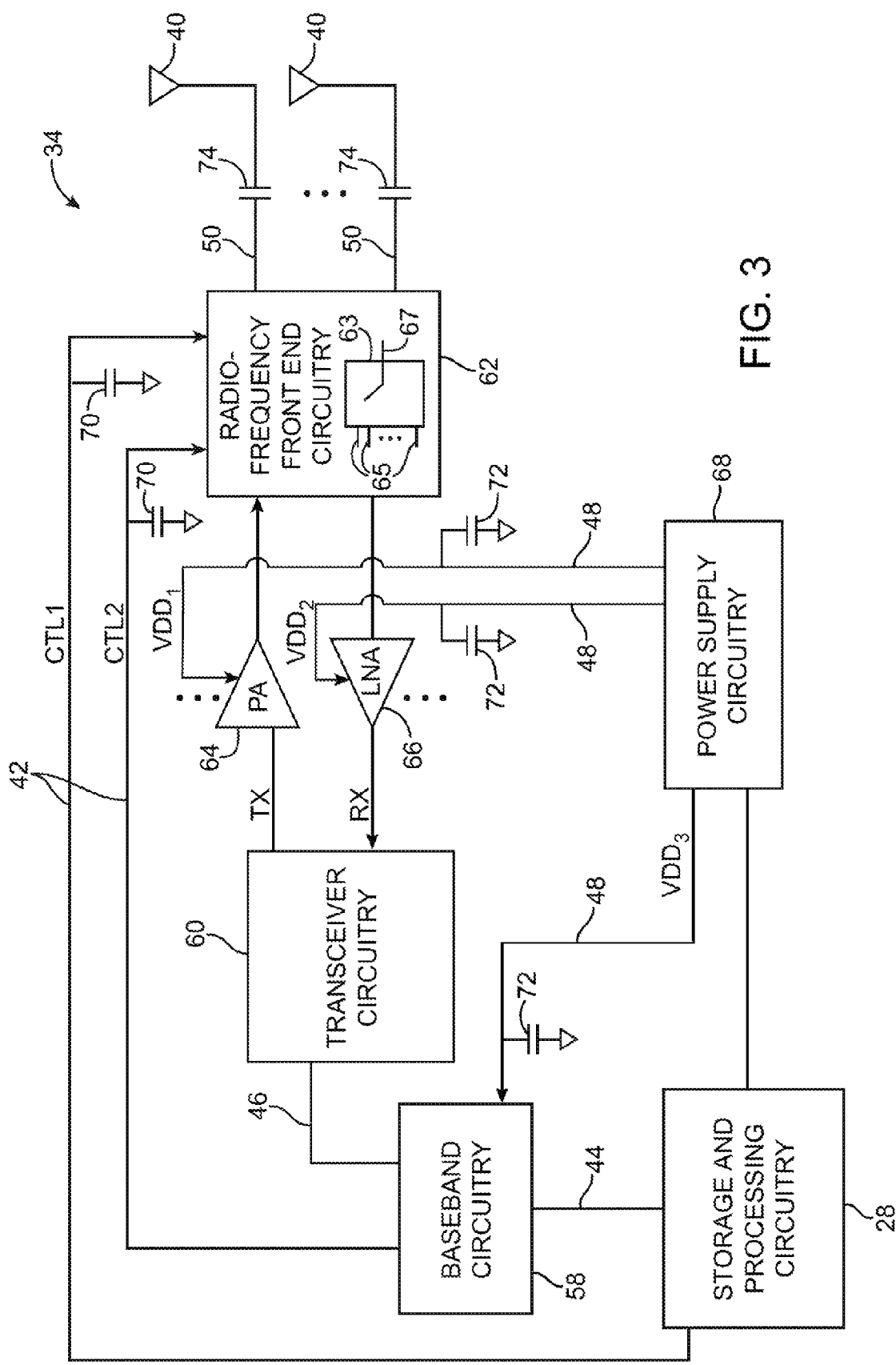
FIG. 3 is a diagram of illustrative wireless communications circuitry having packaged capacitor components in accordance with an embodiment of the present invention.

FIG. 3 is an illustrative diagram of wireless communications circuitry 34. As shown in FIG. 3, wireless communications circuitry 34 may include baseband circuitry 58. Baseband circuitry 58 may include one or more baseband processor integrated circuits. Baseband circuitry 58 may receive data from storage and processing circuitry 28 during radio-frequency transmit operations and may provide data received using antennas 40 to circuitry 28 during radio-frequency receive operations.

Wireless circuitry 34 may include radio-frequency transceiver circuitry 60. Radio-frequency transceiver circuitry 60 may include one or more radio-frequency transceiver circuits such as transmitters and receivers. Some transceivers may include both a transmitter and a receiver. If desired, one or more transceivers may be provided with receiver circuitry, but no transmitter circuitry (e.g., to use in implementing receive diversity schemes).

Baseband processor 58 may receive digital data that is to be transmitted from storage and processing circuitry 28 via path 44 and may use path 46 to provide corresponding baseband signals to radio-frequency transceiver circuitry 60. Radio-frequency transceiver circuitry 60 may convert the baseband signals to radio-frequency signals for transmission using antennas 40. Radio-frequency front end 62 may be coupled between radio-frequency transceiver 60 and antennas 40 and may be used to convey the radio-frequency signals that are produced by radio-frequency transceiver circuitry 60 to antennas 40. Radio-frequency front end 62 may include radio-frequency switches such as switch 63, impedance matching circuits, filters, and other circuitry for forming an interface between antennas 40 and radio-frequency transceiver circuitry 60.

Radio-frequency switch 63 may include ports 65 and 67. Ports 65 may be coupled to transmit and/or receive paths, whereas port 67 may be coupled to an antenna 40. Radio-frequency switch may be configured to couple a selected one of ports 65 to port 67 (e.g., so that a selected transmit or receive path is coupled to antennas 40). Front-end circuitry 62 may include multiple radio-frequency switches 63. The example of FIG. 3 is merely illustrative.

Power amplifier 64 may be coupled between transceiver circuitry 60 and front end circuitry 62 and may be used to amplify radio-frequency transmit signals on transmit path TX (e.g., a path between transceiver circuitry 60 and antennas 40 for transmitting radio-frequency signals from antennas 40). Low noise amplifier (LNA) 66 may be coupled to between transceiver circuitry 60 and front end circuitry 62 and may be used to amplify radio-frequency receive signals on receive path RX (e.g., a path for receiving radio-frequency signals from antennas 40 and providing the radio-frequency signals to receivers of transceiver circuitry 60). The example of FIG. 3 in which wireless communications circuitry 34 includes one transmit and one receive path is merely illustrative. If desired, circuitry 34 may include multiple transmit and receive paths and multiple power amplifiers and low noise amplifiers.

Front end circuitry 62 may be coupled to baseband circuitry 58 and processing circuitry 28 via paths 42. Front end circuitry 62 may be controlled by control signals such as CTL1 and/or CTL2 provided on paths 42. For example, radio-frequency switch 63 in front end circuitry 62 may be configured by control signal CTL2 provided by baseband circuitry 58 in a first configuration in which transmit path TX is coupled to a first antenna 40 or in a second configuration in which transmit path TX is coupled to a second antenna 40. As another example, radio-frequency switch 63 may be configured by control signal CTL1. Control signals such as CTL1 and CTL2 may be differential control signals that each include first and second signal components. The first and second signal components may be provided on respective paths 42 each having an associated decoupling capacitor. Control signal CTL1 may be determined from the difference between the first and second signal components of control signal CTL1.

The example of FIG. 3 in which front end circuitry 62 receives control signals from baseband circuitry 58 and processing circuitry 28 is merely illustrative. If desired, front end circuitry 62 may be controlled by only baseband circuitry 58 or only processing circuitry 28 (e.g., by omitting paths 42 that are coupled to baseband circuitry 58 or processing circuitry 28).

It is generally desirable to provide signal isolation for control signals such as control signals CTL1 and CTL2. This is especially true for multi-band communications in which multiple control signals are used to control front end circuitry to route radio-frequency signals in different communications bands to desired antennas. Decoupling capacitors 70 may be used to help avoid cross-interference between communications in different frequency bands. Decoupling capacitors 70 may be coupled to paths 42 and may serve to provide signal isolation for paths 42. For example, each decoupling capacitor 70 may filter signals on the respective path 42 to block signals at undesired frequencies (e.g., signals associated with different paths 42 and different communications bands).

Power supply circuitry 68 may provide power supply signals for wireless communications circuitry 34 via power supply paths 48. Power supply signal VDD1 may be supplied to power amplifier 64, whereas power supply signal VDD2 may be supplied to low noise amplifier 66 and power supply signal VDD3 may be supplied to baseband circuitry VDD3. If desired, circuitry 68 may be used to supply power supply signals to any active circuitry (e.g., circuitry that draws power during normal operation). Decoupling capacitors 72 may serve to protect circuitry such as amplifier 64 and 66 and baseband circuitry 58 from power supply noise by filtering high-frequency noise (e.g., capacitors 72 may route high-frequency noise to power supply ground terminals).

Antennas 40 may be coupled to front end circuitry 62 via radio-frequency paths 50. Paths 50 may, for example, include traces on a printed circuit substrate that form microstrip paths. In some scenarios, antennas 40 may be coupled to power supply ground terminals and may present direct-current (DC) shorting paths to signal ground. Paths 74 may include direct-current blocking capacitors 74 that block DC current from shorting to signal ground through antennas 40, which helps to reduce unnecessary power consumption. DC blocking capacitors 74 may be coupled in series between portions of path 50.

Figure 4:
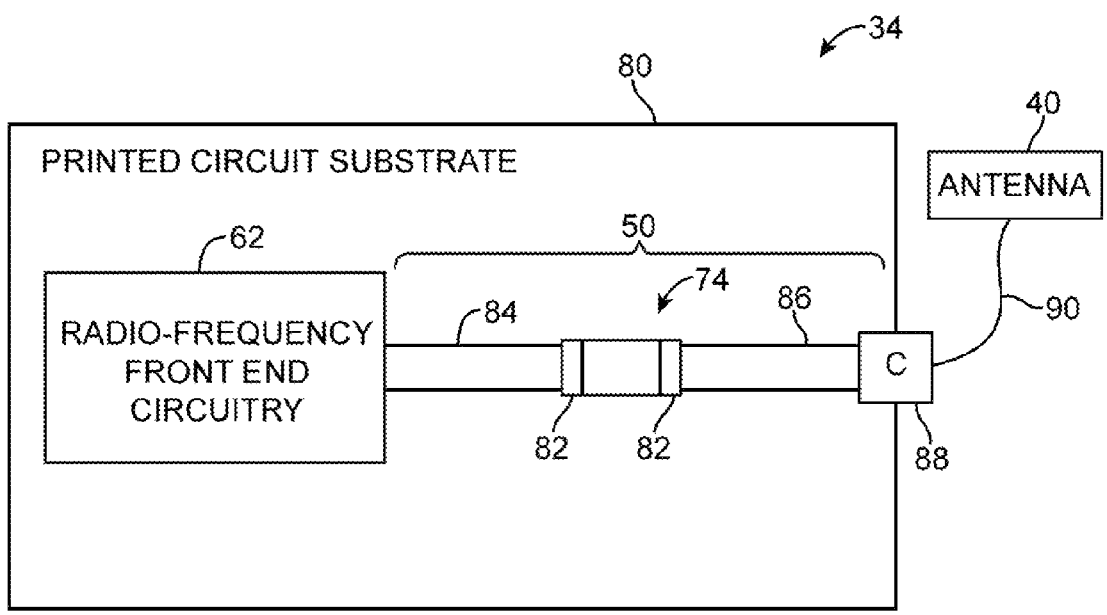
FIG. 4 is a diagram of illustrative wireless communications circuitry with a direct-current blocking packaged capacitor component in accordance with an embodiment of the present invention.

Capacitors such as capacitors 70, 72, and 74 may be packaged capacitor components that are mounted to a printed circuit substrate. For example, the packaged capacitor components may be surface mount technology (SMT) components that are mounted to a surface of the printed circuit substrate via solder. FIG. 4 is an illustrative diagram showing how a packaged capacitor component 74 may serve as a DC blocking capacitor for wireless communications circuitry 34.

As shown in FIG. 4, microstrip path 50 may be formed on a printed circuit substrate 80. Microstrip path 50 may include portions 84 and 86 that are electrically coupled by packaged capacitor component 74. Portions 84 and 86 may be formed from a layer of conductive material such as metal (e.g., copper, aluminum, etc.) deposited on the printed circuit substrate. A separate ground plane (not shown) formed from a conductive material may be provided within the printed circuit substrate underneath and parallel to portions 84 and 86. Packaged capacitor component 74 may include first and second terminals 82 that are coupled to portions 84 and 86, respectively. Terminals 82 may be mounted to the printed circuit substrate via solder to contact microstrip portions 84 and 86.

In the example of FIG. 4, radio-frequency connector 88 may be mounted on printed circuit substrate 80 to contact microstrip portion 86. Connector 88 may be coupled to antenna 40 via radio-frequency cable 90 (e.g., a coaxial cable). During wireless communications, radio-frequency signals may be conveyed between radio-frequency front end circuitry 62 and antenna 40 via microstrip portion 84, packaged capacitor component 74, microstrip portion 86, connector 88, and cable 90. The example of FIG. 4 is merely illustrative. If desired, additional microstrip paths 50 may be formed on printed circuit substrate 34. Connector 88 and cable 90 may be omitted (e.g., in scenarios such as when antenna 40 is directly connected to microstrip path 50). If desired, antenna 40 may be coupled to front end circuitry via a flexible printed circuit substrate such as polyimide. Additional circuitry such as storage and processing circuitry, transceiver circuitry, and/or baseband circuitry may be mounted on printed circuit substrate 80. If desired, radio-frequency front end circuitry 62 may be mounted to a different printed circuit substrate than microstrip path 50.

Figure 5:
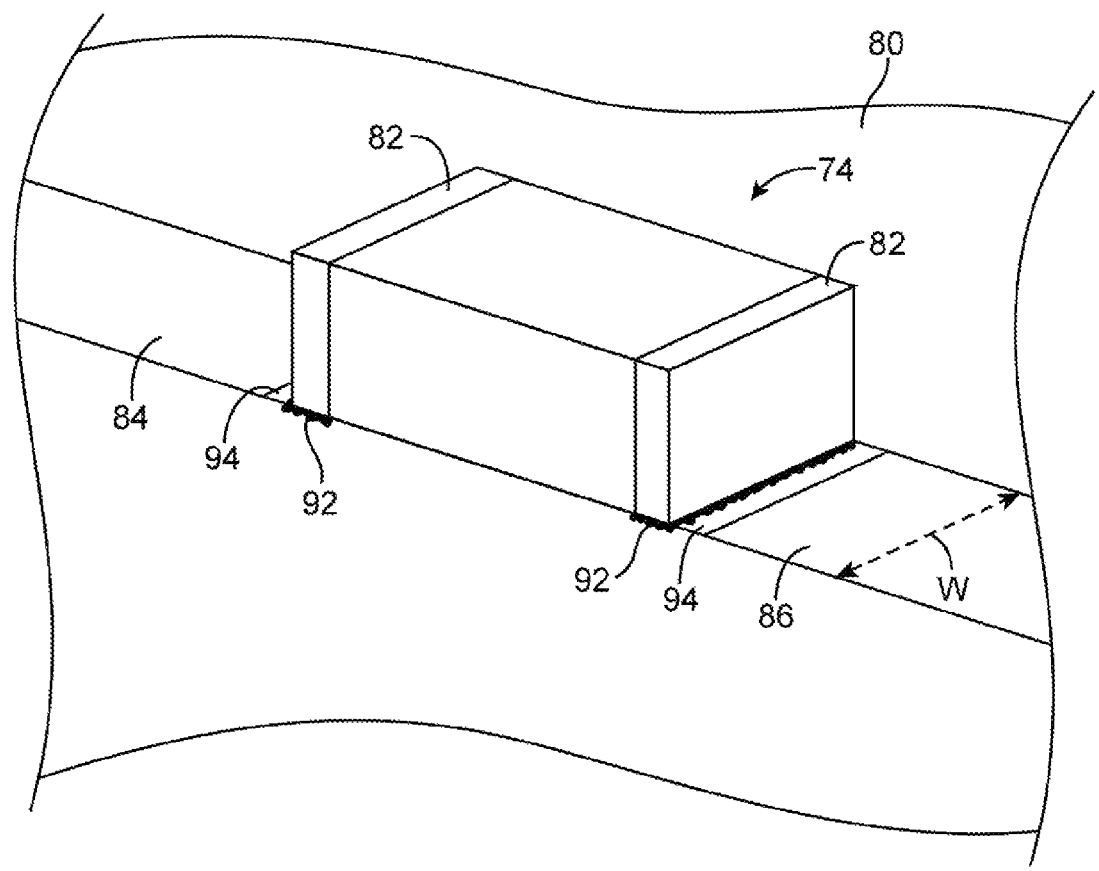
FIG. 5 is a perspective view of an illustrative packaged capacitor component having multiple self-resonance frequencies in accordance with an embodiment of the present invention.

FIG. 5 is a perspective view of packaged capacitor component 74 that is mounted to printed circuit substrate 80. As shown in FIG. 5, packaged capacitor component 74 may have a substantially rectangular shape. Packaged capacitor component 74 may have a rectangular footprint with an area desirable for surface mount technologies. For example, the footprint of component 74 on substrate 80 may be approximately 0.4 mm by 0.2 mm, 0.6 mm by 0.3 mm, or any desired dimensions suitable for surface mounting to substrate 80. The footprint of component 74 may be selected to match width W of microstrip portion 84 (e.g., width W may be 0.4 mm, 0.2 mm, 0.6 mm, 0.3 mm, etc.).

Terminations (terminals) 82 of packaged component 74 may be provided at opposing ends of the packaged component. Terminals 82 may be formed from a coating of conductive materials (e.g., metals or other conductive materials) that covers respective ends of packaged component 74. Terminals 82 may be coupled to microstrip portions 84 and 86 via connections 92. Connections 92 may be formed from solder (e.g., solder joints) that electrically couples terminals 82 to conductive pads 94 on substrate 80.

Figure 6:
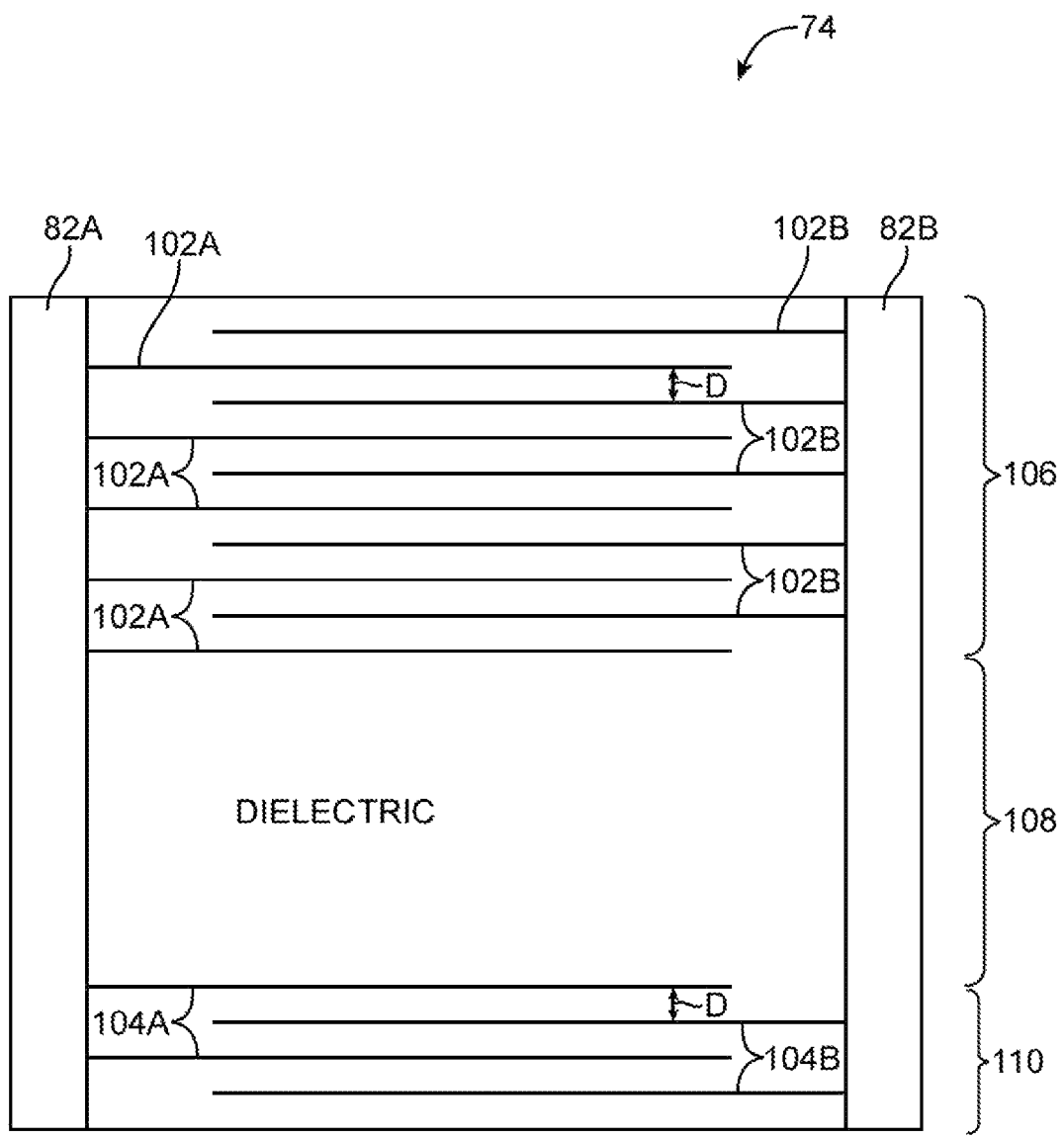
FIG. 6 is a cross-sectional side view of an illustrative packaged capacitor component having multiple self-resonance frequencies in accordance with an embodiment of the present invention.

Packaged capacitor component 74 may accommodate communications in multiple bands while blocking direct-current (DC) signals, thereby serving as a multi-band DC blocking capacitor component. FIG. 6 is a cross-sectional view of a multi-band DC blocking capacitor component 74. As shown in FIG. 6, capacitor component 74 includes metal layers 102A, 102B, 104A, and 104B. The metal layers may be formed from metals such as copper or other metals and, if desired, may be formed from other conductive materials. The metal layers may form rectangular sheets that extend into the page of FIG. 6 (e.g., the footprint of the metal layers may be substantially similar to the footprint of packaged component 74 as shown in FIG. 5).

Each metal layer may be coupled to only one terminal 82. Metal layers 102A and 104A may be coupled to terminal 82A, whereas metal layers 102B and 104B may be coupled to terminal 82B. Metal layers 102A and 102B may be interleaved to form a first parallel plate capacitor portion 106, whereas metal layers 104A and 104B may be interleaved to form a second parallel plate capacitor portion. Capacitor portions 106 and 110 may be isolated by a dielectric portion 108 (e.g., a layer of dielectric material) that does not include any metal layers. Dielectric portion 108 may provide physical and electrical isolation between the metal layers of capacitor portions 106 and 110 so that capacitor portions 106 and 110 serve as separate circuit elements. In other words, dielectric portion 108 may provide sufficient physical isolation so that capacitor portions 106 and 110 function as separate capacitors and not as a single combined capacitor.

Interleaved metal layers may be separated by a distance D. The capacitance of each capacitor portion may depend on the area overlap between adjacent metal layers, distance D between adjacent metal layers, and the number of interleaving metal layers. In the example of FIG. 6, capacitor portion 110 may include four interleaving metal layers separated by distance D (two metal layers 104A interleaved with two metal layers 104B), whereas capacitor portion 106 may include ten interleaving metal layers separated by distance D (five metal layers 102A interleaved with five metal layers 102B). In this scenario, the capacitance of capacitor portion 106 may be approximately 2.5 times the capacitance of capacitor portion 110 (e.g., because the number of interleaved metal layers is 2.5 times greater, whereas the area overlap and distance between adjacent metal layers is substantially similar for both capacitor portions).

Figure 7:
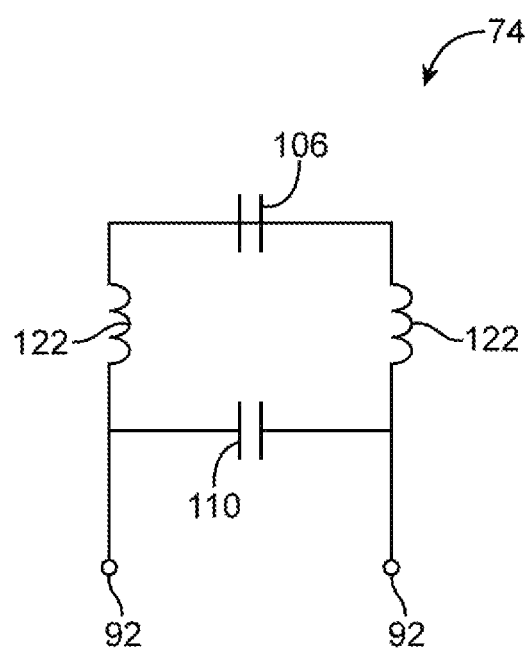
FIG. 7 is a circuit diagram of an illustrative packaged capacitor component having first and second self-resonant frequencies in accordance with an embodiment of the present invention.

An illustrative circuit diagram of packaged capacitor component 74 of FIG. 6 is shown in FIG. 7. As shown in FIG. 7, capacitor portions 106 and 110 may be separated by inductors 122. Inductors 122 may represent intrinsic inductance in the conductive materials of terminals 82A and 82B between capacitor portions 106 and 110. Capacitor portion 110 may be coupled between connections 92 (e.g., packaged capacitor component 74 may be mounted to printed circuit substrate 80 so that capacitor portion 110 is interposed between capacitor portion 106 and printed circuit substrate 80 as shown in FIG. 5). The example of FIG. 7 in which capacitor portion 110 is coupled between connections 92 is merely illustrative. If desired, capacitor portion 106 may be coupled between connections 92 (e.g., by reversing the vertical orientation of capacitor component 74). In the case that packaged capacitor component 74 serves as a DC blocking capacitor, it is generally desirable to stack capacitor portions in order of decreasing self-resonance frequencies (e.g., increasing capacitance) to avoid interference between capacitor portions.

As an example, capacitor portion 106 with a self-resonant frequency for 2.4 GHz communications may be stacked above a capacitor portion 110 with a self-resonant frequency for 5 GHz communications. Each capacitor portion may function as a capacitor at frequencies up to the corresponding self-resonant frequency, but may function as an inductor at frequencies exceeding the self-resonant frequency. If desired, each self-resonant frequency may be selected to be slightly greater than the corresponding communications frequency to help ensure capacitor functionality (e.g., the self-resonant frequency of capacitor portion 106 may be about 3 GHz, whereas the self-resonant frequency of capacitor portion 110 may be about 6.5 GHz). Capacitor portion 110 may therefore still function as a capacitor at 2.4 GHz even though capacitor portion 110 is used for 5 GHz communications, which helps to preserve normal operation for capacitor portion 106 that is used for 2.4 GHz communications.

Figure 8:
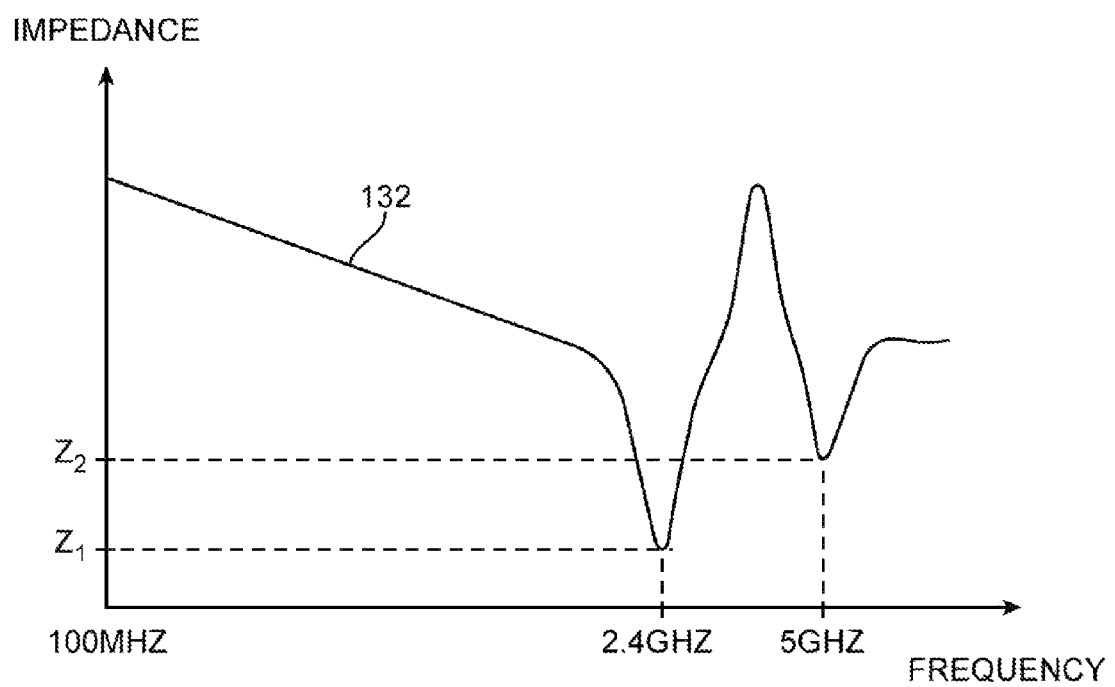
FIG. 8 is a graph showing how a packaged capacitor component may have multiple self-resonant frequencies in accordance with an embodiment of the present invention.

FIG. 8 is an illustrative graph showing how a multi-band packaged capacitor component such as component 74 may have multiple self-resonance frequencies. As shown in FIG. 8, the impedance 132 of component 74 may vary with frequency. The self-resonance of capacitor portion 106 may occur at about 2.4 GHz (or, if desired, at a higher frequency such as 3 GHz), which provides a low impedance path for accommodating communications at 2.4 GHz (e.g., impedance Z1 may be between 1-10 Ohms). At 5 GHz, the self-resonance of capacitor portion 110 may provide a low impedance path for accommodating communications at 5 GHz (e.g., impedance Z2 may be between 1-10 Ohms). Approaching zero frequency (e.g., a DC signal), the impedance of component 74 may increase so that component 74 approximates an open circuit.

Figure 9:
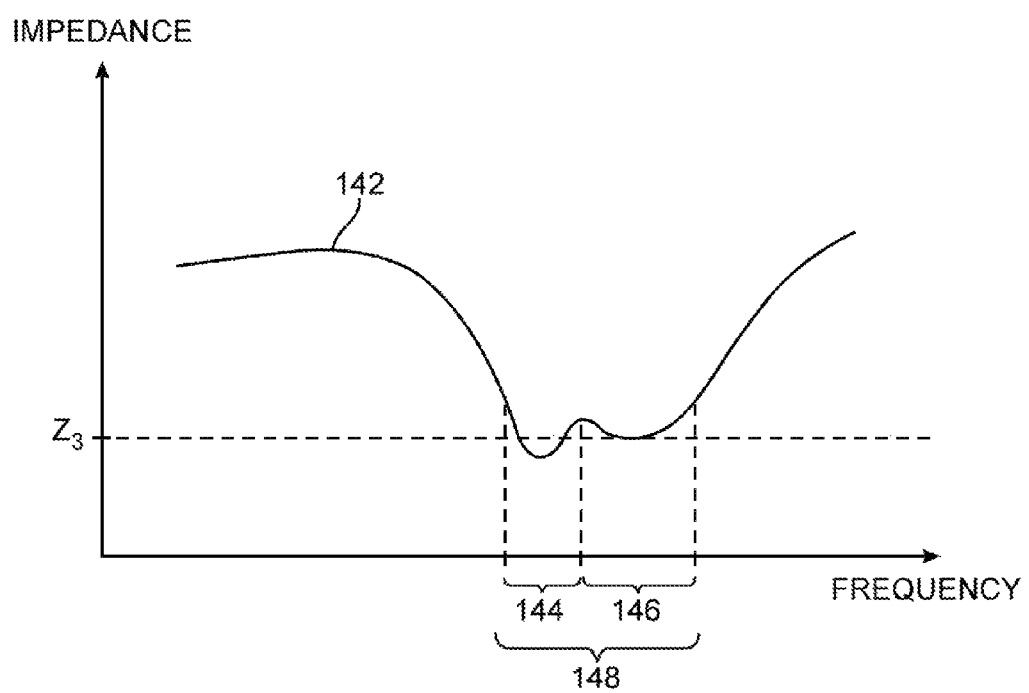
FIG. 9 is a graph showing how a packaged capacitor component may have multiple self-resonant frequencies that form a frequency window in accordance with an embodiment of the present invention.

If desired, a packaged capacitor component may be configured to serve as a decoupling capacitor such as capacitors 70 and 72 of FIG. 3 (e.g., by coupling the packaged capacitor component between a signal line and a power supply ground path). The packaged capacitor component may be configured by selecting the self-resonant frequencies of capacitor portions. FIG. 9 is an illustrative graph showing how a packaged capacitor component such as components 70 and 72 may be configured as a decoupling capacitor.

As shown by line 142, the impedance of a decoupling capacitor component may provide a relatively low impedance of approximately Z3 (e.g., between 1-10 Ohms) within frequency window 148. Window 148 may be composed of portions 144 and 146. Capacitor portions of the packaged capacitor component may contribute to portions 144 and 146 of decoupling band 148. For example, capacitor portion 110 of FIG. 7 may contribute to portion 146, whereas capacitor portion 106 may contribute to portion 144. Because the capacitor portions are physically and electrically separate, the width of frequency window 148 may be increased by the individual contributions of each capacitor portion.

Figure 10:
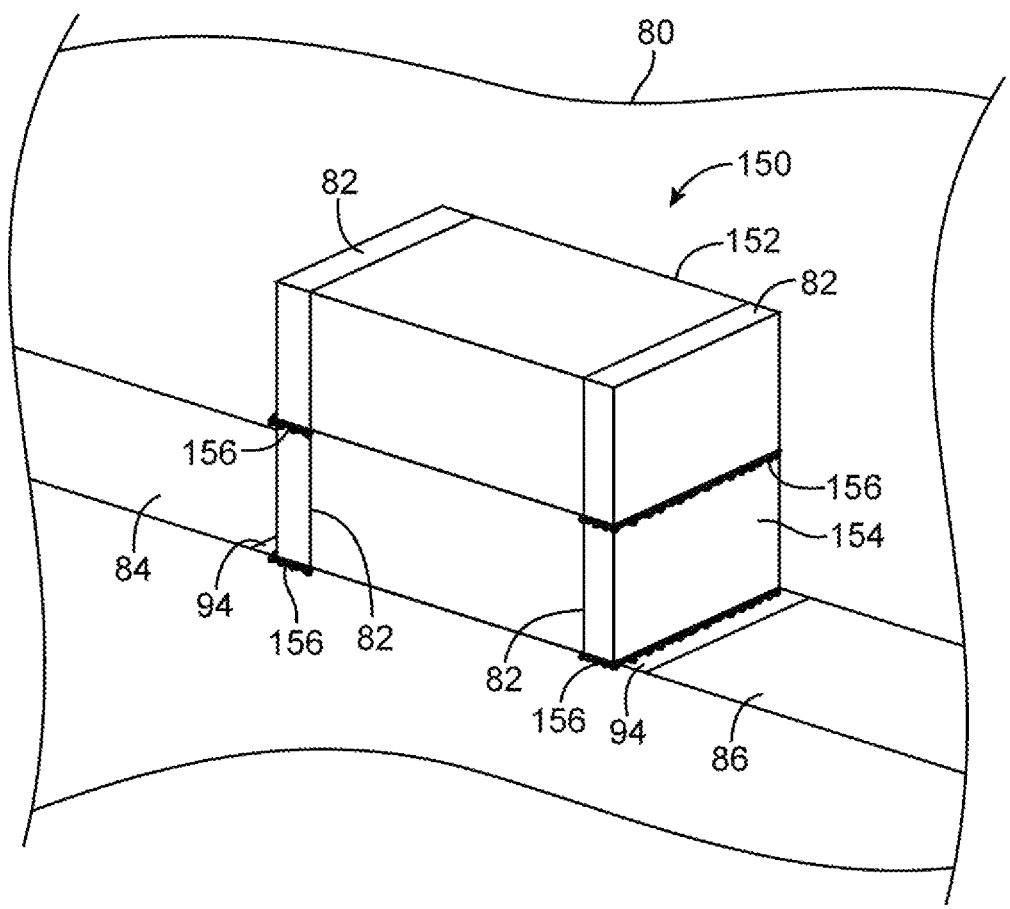
FIG. 10 is a perspective view of an illustrative packaged capacitor component formed from stacked surface mount technology components in accordance with an embodiment of the present invention.

If desired, multiple components may be stacked while ensuring physical and electrical isolation between circuit elements of the components. FIG. 10 is a perspective view of an illustrative multi-component stack 150 that is mounted to contact pads 94 of substrate 80. In the example of FIG. 10, the multi-component stack may be coupled to microstrip paths 84 and 86 to serve as a DC blocking element (e.g., similar to FIGS. 5 and 8). This example is merely illustrative. If desired, the multi-component stack of FIG. 10 may be configured to serve as a decoupling capacitor element (e.g., similar to FIG. 9).

The multi-component stack may include capacitor components 152 and 154 and may be referred to herein as a multi-component package, because components 152 and 154 are combined to form a single package (e.g., a package having the footprint of a single component). Components 152 and 154 may be surface mount technology components and include terminals 82 at opposing ends of each component. Component 152 may be mounted to a top surface of component 154 and component 154 may be mounted to pads 94 of substrate 80 via connections 156. Connections 156 may be formed similarly to connections 92 of FIG. 5 (e.g., using solder).

Connections 156 may provide physical and electrical separation for capacitor components 152 and 154. For example, connections 156 may be solder joints having intrinsic inductance that electrically separates components 152 and 154 so that the multi-component stack functions similarly to packaged capacitor component 74 as shown in FIG. 7 (e.g., capacitor components 152 and 154 may function similarly to capacitor portions 106 and 110). In addition, connections 156 may provide some physical separation due to the thickness of solder joints used to form connections 156.

Figure 11:
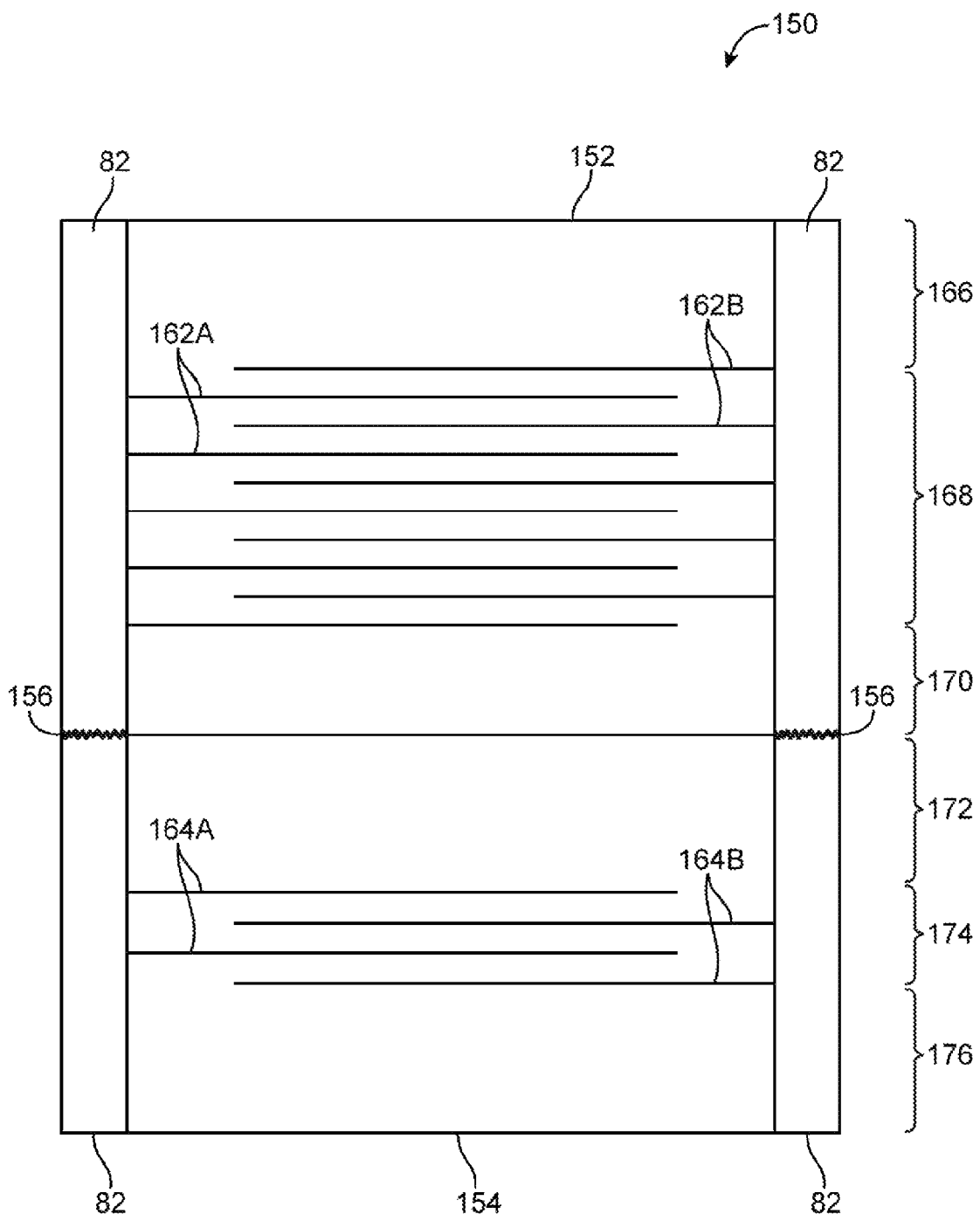
FIG. 11 is a cross-sectional view of an illustrative packaged capacitor component formed from stacked surface mount components in accordance with an embodiment of the present invention.

Components such as components 152 and 154 may be configured to provide electrical separation from adjacent components. FIG. 11 is a cross-sectional view of an illustrative multi-component stack 150. As shown in FIG. 11, multi-component stack 150 may include components 152 and 154 that are coupled by connections 156. Components 152 and 154 may be formed from interleaved metal layers 162A, 162B, 164A, and 164B (e.g., rectangular metal layers that extend into the page of FIG. 11). Metal layers 162A and 162B may be vertically centered within component 152 to form a capacitor portion 168. Capacitor portion 168 may be physically separated from top and bottom surfaces of component 152 by dielectric portions 166 and 170. Similarly, component 154 may include dielectric portions 172 and 176 and capacitor portion 174 formed from interleaved metal layers 164A and 164B.

Dielectric portions 166, 170, 172, and 176 may serve to physically and electrically separate capacitor portions such as portions 168 and 174 from adjacent components. In the example of FIG. 11, dielectric portions 170 and 172 separate capacitor portions 168 and 174 such that multi-component stack 150 functions similarly to the circuit of FIG. 7. For example, intrinsic inductance of connections 156 and conductive materials of terminals 82 that separate capacitor portions 168 and 174 may combine with inductance of connections 156 to form inductors 122.

Figure 12:
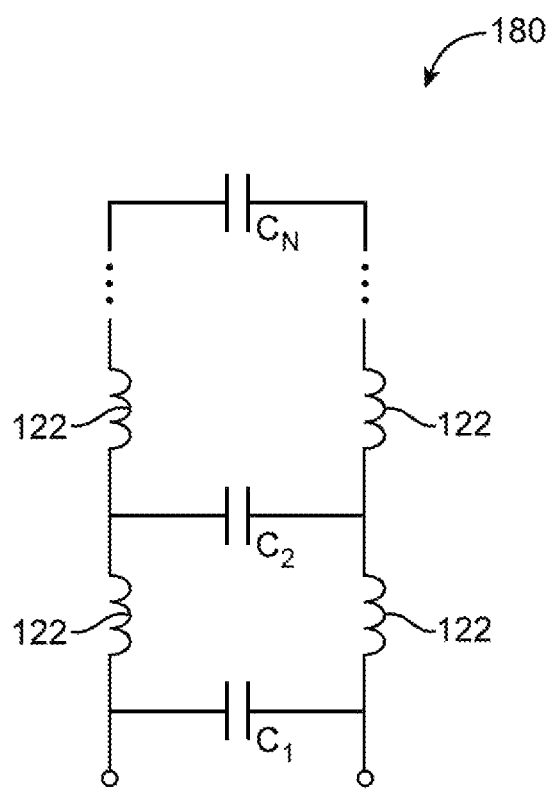
FIG. 12 is a circuit diagram of an illustrative packaged capacitor component having multiple self-resonant frequencies in accordance with an embodiment of the present invention.

A packaged capacitor component or multi-component stack may include any desired number of capacitor portions as shown in circuit diagram 180 of FIG. 12. As shown in FIG. 12, a packaged capacitor component or multi-component stack may include capacitors C1, C2, . . . , CN that are each electrically separated by inductors 122. Inductors 122 may be formed from intrinsic inductances associated with dielectric gaps between capacitor portions (e.g., gap 108 of packaged capacitor component 74 of FIG. 6 or gaps 170 and 172 of multi-component stack 150 of FIG. 11). The capacitor portions may be vertically arranged in order of decreasing self-resonance frequency (e.g., the capacitor portion with the greatest self-resonance frequency may be closest to a printed circuit substrate).

Figure 13:
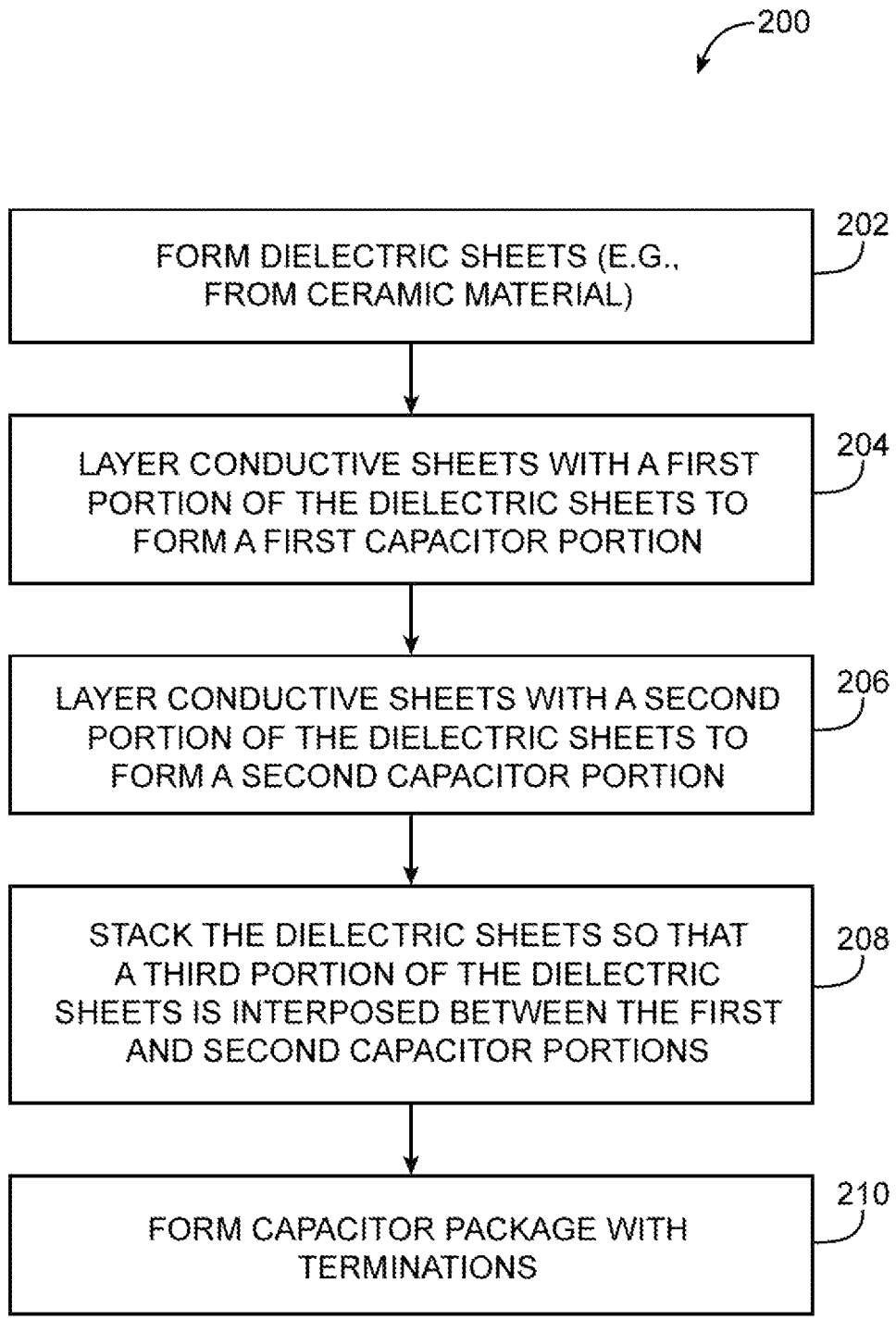
FIG. 13 is a flow chart of illustrative steps that may be performed to manufacture a packaged capacitor component with multiple self-resonance frequencies in accordance with an embodiment of the present invention.

FIG. 13 is a flow chart 200 of illustrative steps that may be performed to manufacture a packaged capacitor component such as component 74 of FIG. 6.

During step 202, dielectric sheets may be formed. The dielectric sheets may be substantially rectangular (or other desired shapes) and may be formed using manufacturing tools such as casting tools. For example, casting tools may be used to form sheets of ceramic materials.

During step 204, conductive sheets may be layered with a first portion of the dielectric sheets to form a first capacitor portion. The conductive sheets may be interleaved at an offset. For example, capacitor portion 106 of FIG. 6 may be formed by layering a first portion of the dielectric sheets with conductive sheets 102A and 102B that are horizontally offset from each other. In this scenario, the thickness of the dielectric sheets may contribute to distance D between adjacent conductive sheets. The conductive sheets may be formed by depositing conductive materials such as copper or other metals on the dielectric sheets (e.g., using deposition tools such as screen printing tools).

During step 206, additional conductive sheets may be layered with a second portion of the dielectric sheets to form a second capacitor portion. For example, capacitor portion 110 of FIG. 6 may be formed by layering a second portion of the dielectric sheets with conductive sheets 104A and 104B (e.g., by depositing conductive material on the second portion of the dielectric sheets to form the additional conductive sheets).

During step 208, the dielectric and conductive sheets may be stacked (e.g., using stacking tools) so that a third portion of the dielectric sheets is interposed between the first and second capacitor portions. The third portion of the dielectric sheets may be stacked without any intervening conductive sheets and may physically and electrically separate the first and second capacitor portions so that the first and second capacitor portions serve as individual capacitor circuit elements. The third portion of the dielectric sheets may, for example, form dielectric layer 108 of FIG. 6.

During step 210, a capacitor package (e.g., package 74 of FIG. 5) may be formed with terminations (terminals) 82. Each termination may be coupled to a respective half of the conductive sheets. For example, a first termination 82A may be coupled to conductive sheets 102A and 104A of FIG. 6, whereas a second termination 82B may be coupled to conductive sheets 102B and 104B that are horizontally offset from sheets 102A and 104A.

The foregoing is merely illustrative of the principles of this invention and various modifications can be made by those skilled in the art without departing from the scope and spirit of the invention.

What is claimed is:

1. An electronic capacitor component having opposing first and second side surfaces, comprising:
   a first terminal that completely covers the first side surface;
   a second terminal that completely covers the second side surface;
   a first capacitor portion formed from interleaving conductive layers, wherein the first capacitor portion has a first self-resonant frequency and the interleaving conductive layers of the first capacitor portion comprise a first set of conductive layers coupled to the first terminal and a second set of conductive layers coupled to the second terminal; and
   a second capacitor portion formed from interleaving conductive layers, wherein the second capacitor portion has a second self-resonant frequency.

2. The electronic capacitor component defined in claim 1 further comprising:
   a dielectric layer interposed between the first and second capacitor portions.

3. The electronic capacitor component defined in claim 2 wherein the dielectric layer comprises a ceramic layer.

4. The electronic capacitor component defined in claim 3 wherein the conductive layers of the first and second capacitor portions comprise metal layers.

5. The electronic capacitor component defined in claim 4 wherein the metal layers comprise copper layers.

6. The electronic capacitor component defined in claim 2 wherein the first set of conductive layers is offset from and interleaves with the second set of conductive layers.

7. An electronic capacitor component, comprising:
   a first capacitor portion formed from interleaving conductive layers, wherein the first capacitor portion has a first self-resonant frequency;
   a second capacitor portion formed from interleaving conductive layers, wherein the second capacitor portion has a second self-resonant frequency;
   a dielectric layer interposed between the first and second capacitor portions, wherein the interleaving conductive layers of the first capacitor portion comprises first and second sets of conductive layers, the first set of conductive layers is offset from and interleaves with the second set of conductive layers, the interleaving conductive layers of the second capacitor portion comprises third and fourth sets of conductive layers, and the third set of conductive layers is offset from and interleaves with the fourth set of conductive layers.

8. The electronic capacitor component defined in claim 7 wherein the electronic capacitor component is a surface mount component, the surface mount component comprising:
   a first conductive terminal electrically coupled to the first and third sets of conductive layers; and
   a second conductive terminal electrically coupled to the second and fourth sets of conductive layers.

9. The electronic capacitor component defined in claim 8 further comprising:
   a first set of dielectric layers interposed between the first and second sets of conductive layers; and
   a second set of dielectric layers interposed between the third and fourth sets of conductive layers.

10. An electronic capacitor component, comprising:
    a first capacitor portion formed from interleaving conductive layers, wherein the first capacitor portion has a first self-resonant frequency; and
    a second capacitor portion formed from interleaving conductive layers, wherein the second capacitor portion has a second self-resonant frequency that is greater than the first self-resonant frequency, the electronic capacitor component is mounted to a surface of a substrate, and an entirety of the second capacitor portion is interposed between the first capacitor portion and the substrate.

11. The electronic capacitor component defined in claim 10, further comprising:
    a dielectric layer interposed between the first and second capacitor portions.

12. The electronic capacitor component defined in claim 10, further comprising:
    a first terminal; and
    a second terminal, wherein the interleaving conductive layers of the first capacitor portion comprise a first plurality of conductive layers connected to the first terminal and a second plurality of conductive layers coupled to the second terminal.

13. The electronic capacitor component defined in claim 12, wherein the interleaving conductive layers of the second capacitor portion comprise a third plurality of conductive layers connected to the first terminal and a fourth plurality of conductive layers coupled to the second terminal.

14. The electronic capacitor component defined in claim 13, wherein the first plurality of conductive layers are not connected to the second terminal and the second plurality of conductive layers are not connected to the first terminal.

15. The electronic capacitor component defined in claim 14, wherein the third plurality of conductive layers is not connected to the second terminal and the fourth plurality of conductive layers is not connected to the first terminal.

16. The electronic capacitor component defined in claim 13, wherein the first and second terminals are soldered to traces on a printed circuit board.

* * * * *